(12) United States Patent
McKivergan

(10) Patent No.: US 6,329,953 B1
(45) Date of Patent: Dec. 11, 2001

(54) METHOD AND SYSTEM FOR RATING ANTENNA PERFORMANCE

(75) Inventor: Patrick D. McKivergan, Scotts Valley, CA (US)

(73) Assignee: RangeStar Wireless, Aptos, CA (US)

( * ) Notice: Subject to any disclaimer, the term of this patent is extended or adjusted under 35 U.S.C. 154(b) by 0 days.

(21) Appl. No.: 09/676,590

(22) Filed: Sep. 29, 2000

(51) Int. Cl.$^7$ .............................. G01R 1/24; H04B 17/00
(52) U.S. Cl. .................... 343/703; 455/67.1; 455/67.4
(58) Field of Search ................. 343/703, 894, 343/850; 455/67.1, 67.4

(56) References Cited

U.S. PATENT DOCUMENTS

| | | | |
|---|---|---|---|
| 4,811,023 | * 3/1989 | Gelernter et al. | 343/703 |
| 5,233,537 | 8/1993 | Tietsworth | 364/481 |
| 5,300,939 | 4/1994 | Maeda et al. | 343/703 |
| 5,507,101 | 4/1996 | Mason | 33/608 |
| 5,548,820 | 8/1996 | Victorin | 455/67.4 |
| 5,574,981 | 11/1996 | Ahonen | 455/67.4 |
| 5,590,415 | 12/1996 | Peltola et al. | 455/115 |
| 5,670,965 | 9/1997 | Tuovinen et al. | 343/703 |
| 5,856,809 | 1/1999 | Schoepfer | 343/703 |
| 5,949,380 | * 9/1999 | Swank, II | 343/703 |
| 5,969,664 | 10/1999 | Beford et al. | 342/37 |
| 6,021,315 | * 2/2000 | Telewski | 455/67.1 |
| 6,031,498 | 2/2000 | Issler . | |

* cited by examiner

*Primary Examiner*—Don Wong
*Assistant Examiner*—Hoang Nguyen
(74) *Attorney, Agent, or Firm*—Albert P. Halluin; John A. Bendrick; Howrey Simon Arnold & White, LLP

(57) ABSTRACT

A system and method for rating the performance of competing antennas under various environmental conditions is herein disclosed. The present invention provides a method to statistically characterize antenna performance, relating actual operating conditions to the likelihood of completing a reliable wireless communication link within a desired confidence level. The invention provides a system and method to predict antenna performance based upon actual usage condition factors, such as power needed for transmitting, and radiation absorption by a user, relative to the angle of orientation between the antenna under test and a corresponding antenna on the opposite side of a wireless communication link.

19 Claims, 8 Drawing Sheets

Schematic Representation of an Anechoic Chamber and Testing Apparatus

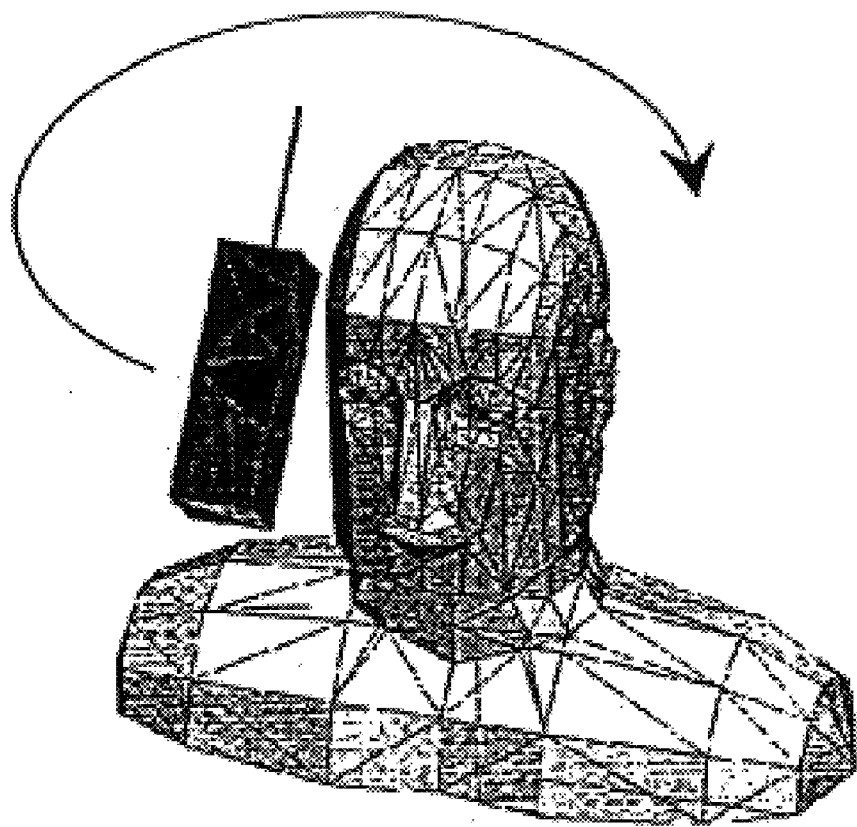
Figure 1. 60 Degree Talk Position

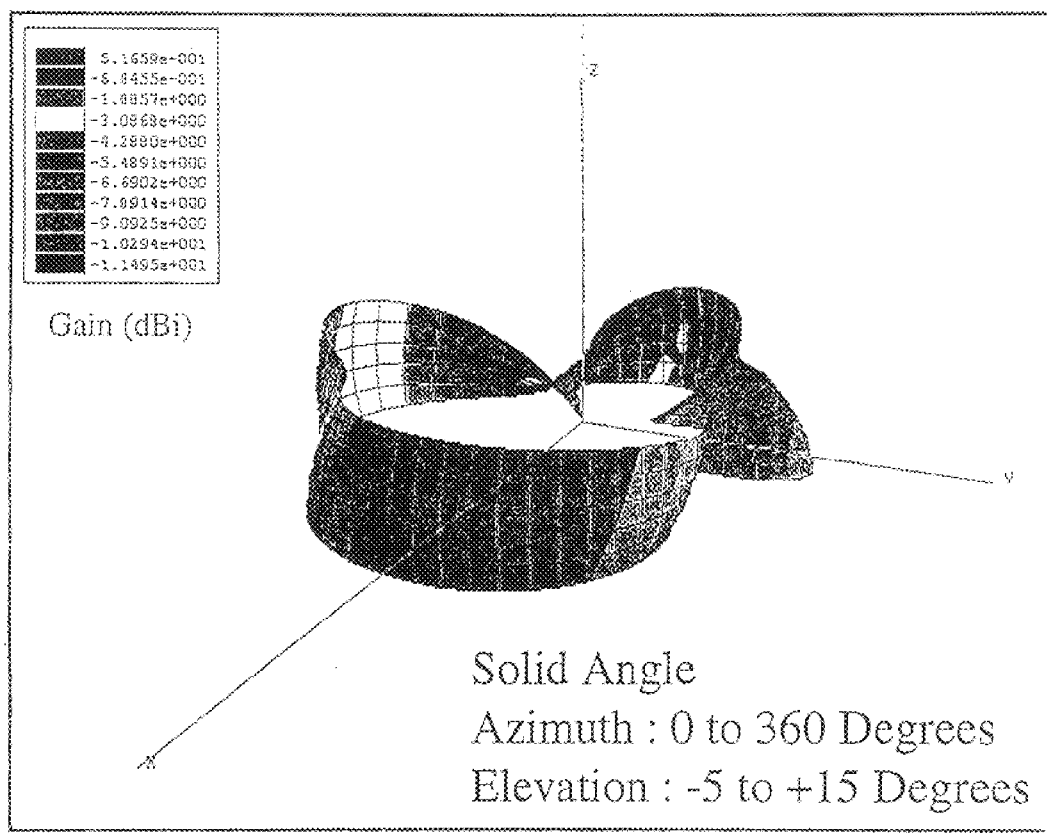
Figure 2. Monopole Gain in Talk Position

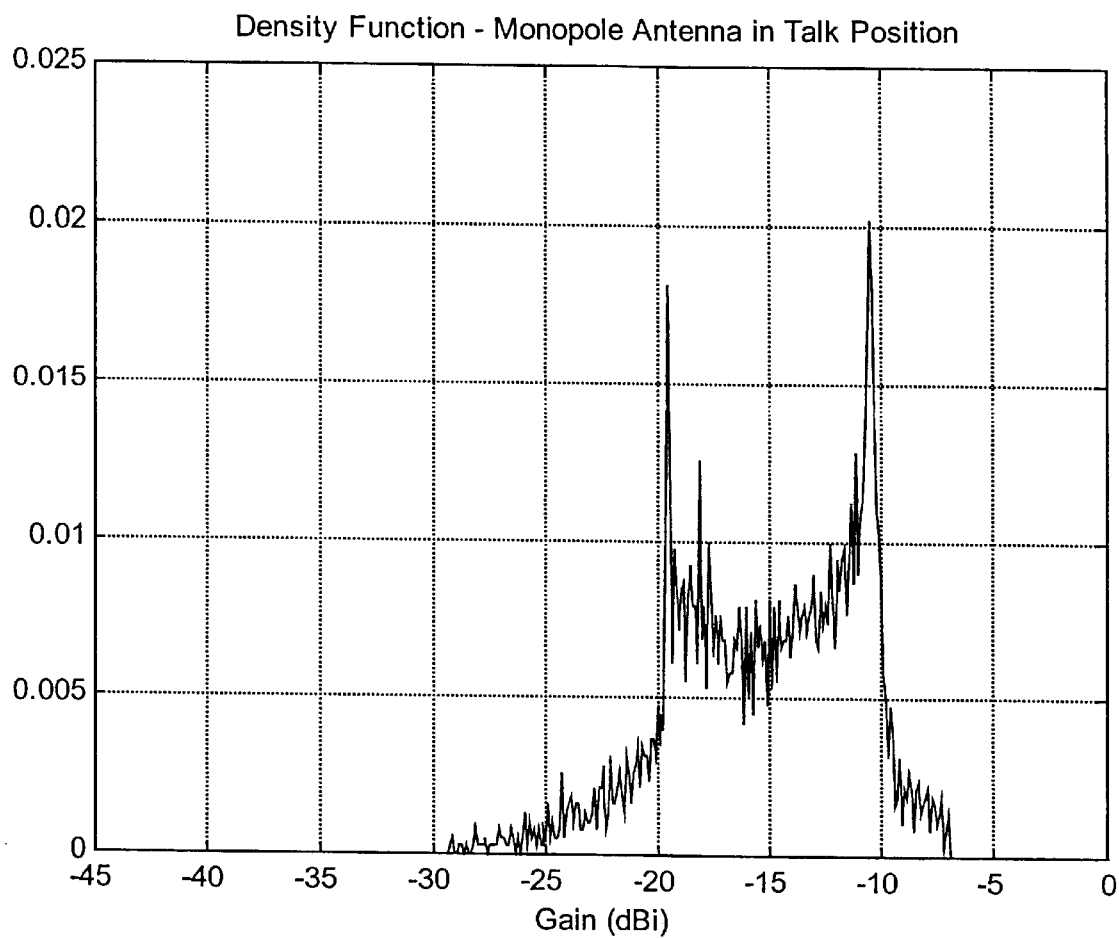
Figure 3. Density Function for a Monopole Antenna in Talk Position

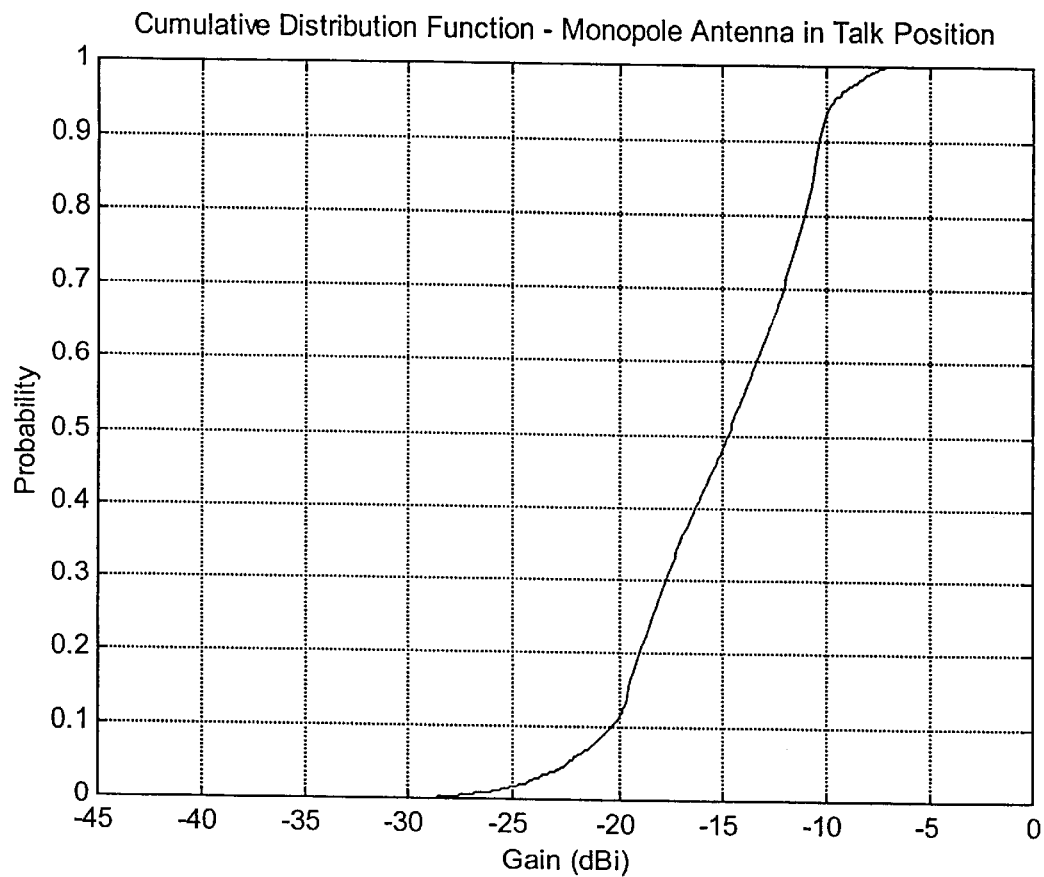
Figure 4. Cumulative Distribution Function for a Monopole Antenna in Talk Position

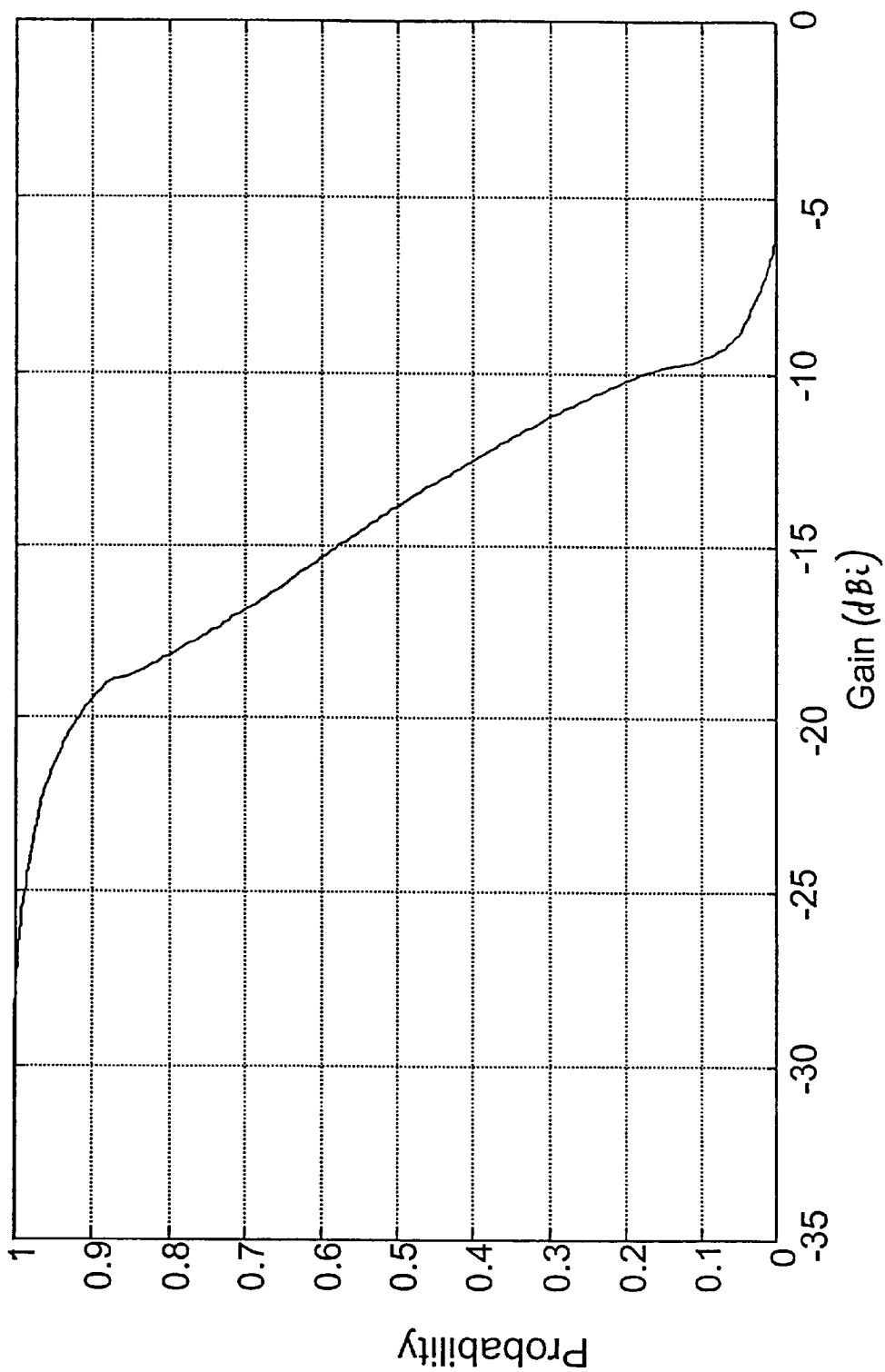
Figure 5. Gain Probability of Monopole in Talk Position

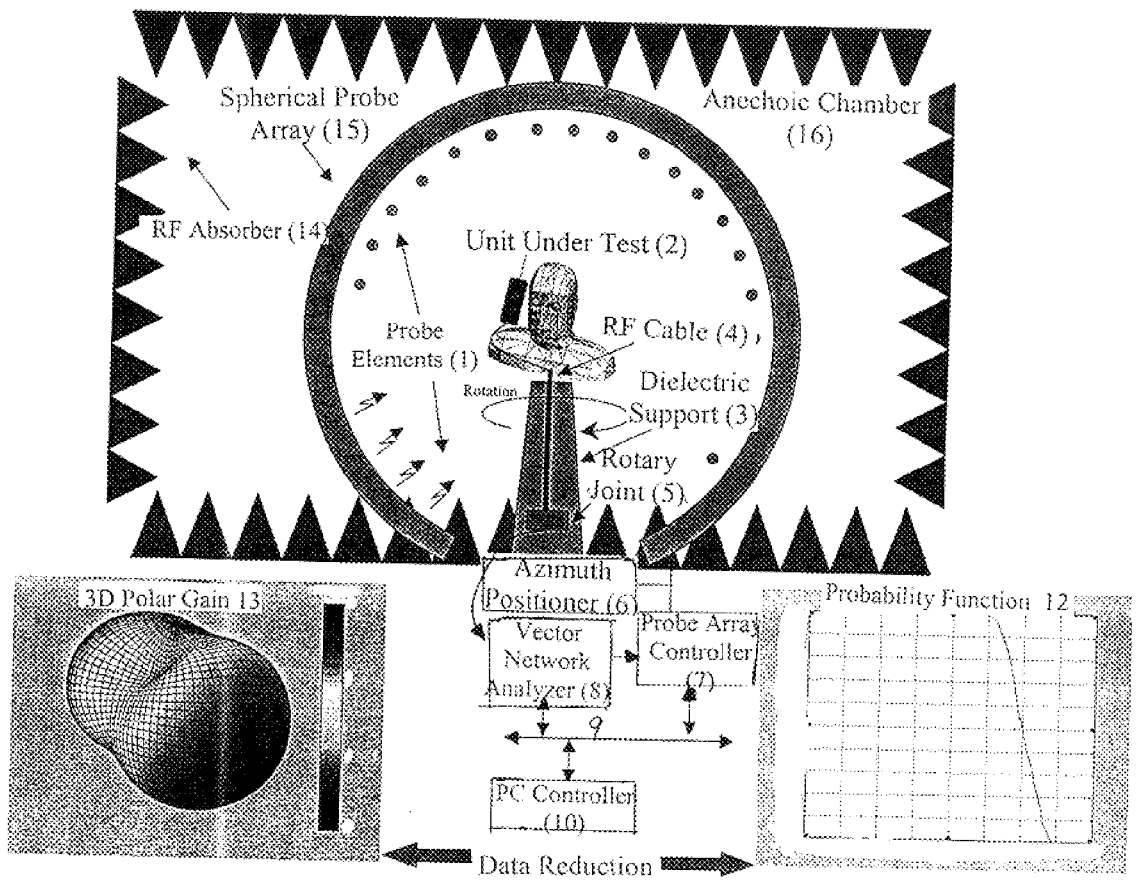
Figure 6. Schematic Representation of an Anachoic Chamber and Testing Apparatus

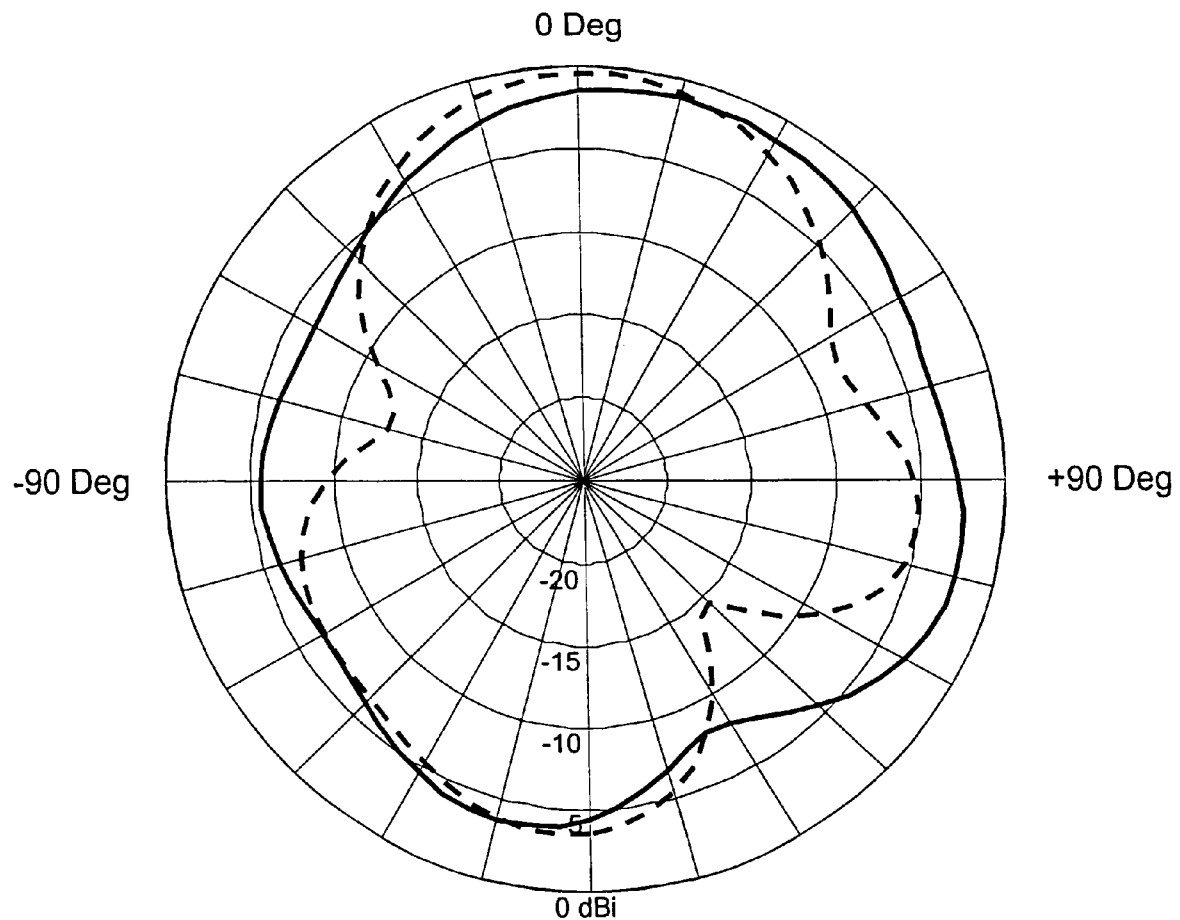
*Figure 7: Total gain, Angle = 90degrees: Performa Pro(solid), Monopole (dashed).*

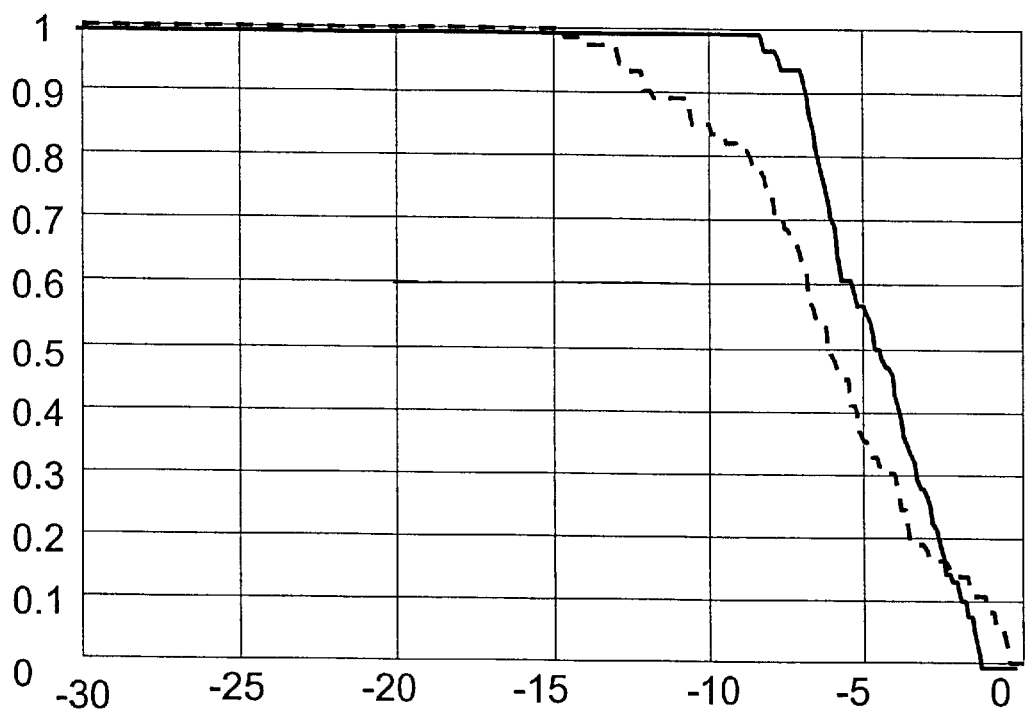
Figure 8. Total Gain ("True Gain") of the PerformaPro Antenna (Solid), and a Monopole Antenna (dashed)

US 6,329,953 B1

METHOD AND SYSTEM FOR RATING ANTENNA PERFORMANCE

FIELD OF THE INVENTION

The present invention relates to antenna performance rating systems, and more specifically to a system a measuring the performance of competing antennas under designated environmental conditions.

BACKGROUND OF THE INVENTION

In designing a wireless network, a designer will position the base stations such that they will provide optimum coverage and, hence, revenue. The designer must work out a link budget to assure that the wireless subscriber's handset is able to communicate with acceptable quality within the advertised coverage area. This link budget involves determining the optimum number of base stations and the effective radiated power (ERP) of each base station. Since designing a link that would be 100% reliable under all conditions would be cost prohibitive, network providers strive to minimize the drop rate of mobile phone communications to a commercially acceptable level, e.g., 5%. Thus, designers of mobile wireless communication systems typically specify a confidence level, e.g., 95%, of communication link success between the mobile and the base station.

Prior art methods of rating antennas used in mobile wireless communication systems measure the peak or average gain of the antenna only. Additionally, it is common practice to assume a constant gain for both transmit and receive antennas. This assumption is valid for a base station transmit antenna since its position and operating conditions are stable. The receive antenna (such as in a handset or other wireless communication device), however, operates in a much more complicated environment in which reception and transmission conditions vary greatly. First, its orientation in 3-dimensional space is somewhat arbitrary since different users hold the communication device in different orientations (referred to as the "range of talk positions"). Second, what might otherwise be an omni-direction pattern of signal radiation from the mobile antenna becomes a directional pattern because of absorption of the radio signal by the head and hand of the user. Thus, the gain of the handset antenna is a function of both the azimuth angle and the elevation angle, as well as the absorption of the signal by the user.

Previous methods of measuring antenna performance are disclosed, for example, in U.S. Pat. Nos.: 5,233,537; 5,300,939; 5,507,101; 5,548,820; 5,574,981; 5,590,415; 5,670,965; 5,856,809; 5,969,664; and 6,031,498. These and all other patents cited herein are each hereby specifically incorporated herein in their entirety by reference. As mentioned above, all of these previous methods rely upon a measure of the peak or average gain only, which is defined as Peak/ave. However, the peak gain occurs at only one point in space. Thus, there is a need in the field of wireless communications for a method of measuring the performance of antennas such that a power budget can be set to provide a reliable link performance in its operation environment over the intended field of view. Many wireless communication devices are portable and are used in an arbitrary orientation relative a corresponding send/receive station. Therefore, the environmental conditions for the receive antenna can vary greatly. Thus, there is a need in the field of wireless communications for a method of measuring antenna performance wherein the operating angle of the receive antenna relative to the base station varies, reflecting actual operating conditions. Furthermore, prior art methods also assume a constant, omni-directional signal radiation from the handset antenna. However, as explained above, the hand and head of the user absorbs radiation from the handset antenna, thus distorting the pattern of radiation from the handset antenna. Thus, there is a need in the field of wireless communications for a method of measuring the absorption of radiated signal energy by the user's hand and head. The present invention addresses all of these shortcomings of prior art antenna performance measuring systems.

SUMMARY OF THE INVENTION

One aspect of the present invention is a method of comparing the relative power needed for different antennas for a desired level of performance under designated environmental conditions, e.g., field of view, i.e., azimuth and elevation ranges.

Another aspect of the present invention is a method for statistically characterizing antenna performance in various environmental conditions so as to allow system designers to achieve a certain transmission confidence level.

Another aspect of the present invention is a method for determining the minimum power level needed for a particular level of gain to complete a reliable wireless communication link.

Another aspect of the present invention is a method of comparing different antennas over a range of power levels and usage conditions.

Another aspect of the present invention is determining the performance of an antenna within a wireless communication device.

BRIEF DESCRIPTION OF THE DRAWINGS

FIG. 1. Representation of the typical angle with which a handheld phone is held by a user.

FIG. 2. Example of the measured gain of a monopole antenna over a typical field of view.

FIG. 3. Example of antenna performance data plotted as a probability density function for a simple monopole antenna in talk position.

FIG. 4. Example of data from a probability density function converted into a cumulative distribution function for a simple monopole antenna in talk position.

FIG. 5. Example of a gain probability function for a 75 mm whip antenna in talk position.

FIG. 6. Schematic representation of anechoic chamber and testing apparatus.

FIG. 7. Example of a polar plot of the total gain at theta =90 for the Performa Pro™ antenna and a monopole antenna.

FIG. 8. Example of data representing the fraction over a scan angle that the Performa Pro™ (designated "400301") and the monopole antenna will have a gain greater than a particular value, referred to as "total gain" or "true gain".

DETAILED DESCRIPTION OF THE INVENTION

Antenna performance measurement using the present invention can be done in a wide variety of means, including, but not limited to: bare antennas, antennas mounted in cell phones, mobile and desktop computers, PDAs, GPS receivers, etc. A particular embodiment is described herein, which refers to cell phones as an example. However, the present invention is applicable to a wide a variety of antenna usages. Furthermore, this statistical performance rating of the present invention can be performed using either send or receive functions. While the detailed description enclosed herein primarily addresses particular embodiment procedures for antenna testing and comparison using the receive mode, the statistical performance rating of the invention can be performed using either the receive or the send function of an antenna or device containing one or more antennae. Briefly, statistical performance characterization using the send function would be very similar to the method used in receive mode (as described in detail herein), except that the unit under test would send out signals of desired frequency range to be collected by a signal analyzer. The results are tabulated and the statistical calculations are made using the same method for send or receive mode of data collection. When sending (also called broadcasting) signals from the unit under test, the gain is directly related to the amount of power fed into the unit in order to produce the outgoing signal. Thus the greater the amount of power fed into a properly tuned and matched antenna circuit during broadcast, the stronger the signal and the higher the gain, as would be obvious to one skilled in the art. For an antenna that is not perfectly omni-directional, different power levels may be needed to complete a wireless communication link in different directional orientations, operational angles and environmental conditions, relative to the corresponding receive antenna. Therefore the present invention can be used to measure and statistically characterize the performance of an antenna, or a device containing one or more antennae, where the performance is a function of the amount of power needed for broadcasting a signal in order to complete a wireless link within a desired level of probability for a satisfactory link. Furthermore, the present invention would allow a user to statistically predict which candidate antenna would require less transmit power to complete a satisfactory link, and thus, which antenna would be expected to allow the wireless communication device to run the longest on a given battery.

The first step to characterizing the antenna performance is to define its nominal operating environment. Typically, a user will hold a mobile phone at 60 degrees from the vertical as shown in FIG. 1 on either the right or left side of the head. This 60 degree angle can be referred to as "talk position". With the phone in this position, the base station position in azimuth can typically be assumed to be equally probable over 360 degrees. The base station, meanwhile, is assumed to be at an elevation ranging from −5 to +15 degrees. GPS, Bluetooth®, ISM or other data or voice links, as would be obvious to one skilled in the art, can benefit from 360 degree directional tests to simulate actual usage. The gain of the monopole over this field of view (FOV) is illustrated in FIG. 2. Elevations higher than 15 degrees are not measured for cell phone antennas since this would indicate that the distance to the base station is close enough so that antenna gain will not be a limiting factor.

The next step is to determine the Probability Density Function of the gain over this field of view and integrate that distribution to form the Gain Distribution Function. Finally, this Gain Distribution Function is inverted to provide a measure of the probability that the antenna gain within the solid angle is greater than a given confidence value. Mathematically, these steps are described as follows:

$FG(a) = P(G \geq a)$ [Probability Distribution Function]

$f_G(\alpha) = \frac{d}{d\alpha} F_G(\alpha)$ [Probability Density Function, derived from antenna measurements or simulation over the specified solid angle]

$F_G(\alpha) = \int_{-\infty}^{\alpha^+} f_G(u) du$ [Gain Distribution Function]

The Gain Probability Function is defined in terms of the probability of exceeding a specified gain as:

$G_p(a) = 1 - F_G(a) = P(G > a)$ $G_p(\alpha) = 1 - \int_{-\infty}^{\alpha^+} f_G(u) du$ [the Gain Probability Function]

The density function, $f_G(u)$, is determined by calculating a gain histogram over the field-of-view which is then integrated to form the Gain Probability Function. An example of a density function and the associated cumulative distribution function for a 75 mm monopole in talk position is shown in FIG. 3 and FIG. 4, respectively. An additional method of analysis is depicted in FIG. 5, which represents the fraction over a scan angle that a 75 mm whip antenna in talk position will have a gain greater than a particular value.

FIG. 6 is a schematic representation of the testing apparatus and the anechoic chamber of the present invention. The anechoic chamber is used in the invention's present best mode, however, one skilled in the art would recognize that other test environments could be used and the testing apparatus of the present invention. In order for the Gain Probability Function of the present invention to be calculated, the requisite data must be acquired from the unit under test (UUT). The basic procedure is as follows:

Install the UUT (2) on the dielectric support (3) within the Anechoic Chamber (16).

Connect the RF cable (4) to the UUT (2). The RF cable is connected via a Rotary Joint (5) to Port 2 of the Vector Network Analyzer (8).

The RF absorber (14) is used to minimize wave reflections within the Anechoic Chamber (16) which would otherwise corrupt the antenna measurement.

The data acquisition parameters (frequency, azimuth range, elevation range, power level, polarization) are set using the application software installed on the PC controller (10).

The necessary data is transmitted to the Probe Array Controller (7) and Vector Network Analyzer (8) via the GPIB interface (9).

The Probe Array Controller controls the Azimuth Positioner (6) and sequentially activates the Probe Elements (1) of the Spherical Probe Array (15) at each azimuth position with an RF signal provided by Port 1 of the Vector Network Analyzer (8); the RF signal can include a scan over a desired range of frequencies.

The response of the UUT (2) is measured on Port 2 of Vector Network Analyzer (8) for each position over the azimuth/elevation range; the response is detected as output voltage from the antenna or device containing the antenna, which is then converted by the analyzer to power, which is related to the gain of the antenna.

The data is converted to calibrated gain (13) and stored by the PC controller (10) The calibrated gain data (13)

over the specified azimuth/elevation range forms the basis for the Gain Probability Function computation (12) described herein.

For a cellular phone network, the polarization is assumed to be vertical, however, scattering from nearby objects as well as ground reflections result in polarization diversity. The present invention can characterize both vertical and total gain to account for performance variations due to multi-path effects. Additionally, the present invention allows a much more robust basis for antenna comparison than simply peak or average gain since the ordered statistical method of the present invention is impervious to deep nulls which can bias average gain measurements.

Additionally, the present invention provides a method to predict the amount of radiation that would be absorbed by the user of the wireless communication device. The radiation absorbed by a user, called SAR (Specific Absorption Rate), is dependent upon the power level needed to complete a communication link, and may also depend upon the antenna performance in different angles of orientation, for antennae which are not perfectly omni-directional. Because the invention allows statistical prediction of power level, and direction dependence, the radiation absorbed by a user of communication devices containing different antennae can also be statistically compared.

The current best mode for gathering data for computing the Gain Probability Function of the present invention is described as follows (various modifications can be made by one of skill in the art without departing from the scope of the presently claimed invention):

1) Determine the usage model parameters, e.g., a frequency band, a bare antenna or an antenna installed in a device, on a tabletop, in a handheld or in a wristwatch, or other antenna applications.

2) Determine the field of view parameters for a wireless link, i.e., the azimuth range and the elevation range.

3) Run a test set of data for calibration using a known antenna (e.g., a standard dipole antenna), which will serve as a control for comparison of the unit to be tested.

4) Place the unit in an anechoic chamber by: affixing to a bare pedestal, worn or held by a person, or mounted on a phantom head with hand filled with SAR solution that approximates the absorption of a real person's head and hand, or, alternatively, in a plastic container and rubber glove filled with SAR solution, as schematically depicted in FIG. 6 (glove not pictured).

5) Provide an excitation signal (source signal), which is generated by a network analyzer (such as the Agilent® HP 8753®); in the particular embodiment described herein for cell phones, the signal is a planar wave signal which can be stepped over the frequency band to cover the desired frequency range. Alternatively, the input signal could be a near field signal, a far field signal or another type of excitation signal; in an additional alternative embodiment, the actual modulated signal could be used (such as CDMA, PCS, GSM, TDMA or other protocols) in which case the ordered statistic method could be indicative of sensitivity, rather than calibrated gain. Alternatively, an antenna within a wireless communication device, rather than just a bare antenna, could be tested.

6) The response is measured by a signal recording circuit in the form of voltage out from the terminals of the unit under test; measured voltage is converted to power by the signal analyzer and recorded digitally on computer memory by the application software employed by the network analyzer or other software capable of manipulating data and storing in a particular configuration as desired by the user; the data is managed by the vector network analyzer, and can be transferred via a general purpose interface bus (GPIB); the data management can be referenced to IEEE 488 standard for the GPIB.

7) The test pedestal is then rotated step-wise over a range of elevation and azimuth angles for each frequency range tested, with a selected bandwidth of frequencies being tested in a step-wise manner.

Thus, the measurement parameters can include frequencies, azimuth angle and elevation ranges. The measurement parameters can also be environmental conditions such as polarization shift due to reflections of the signal off of various physical structures. The data format is predetermined by the user or dictated by the particular software requirements, but is typically ASCII or binary. The predetermined order of testing steps is controlled by the applications software.

After collection of measurement data, the data is then used to generate a histogram and then calculate the Gain Distribution Function and the Gain Probability Function. The histogram data form a set of bins, min>max, over the range of points. This then becomes the basis for plotting the density function. For each frequency tested, the data generated for each elevation and azimuth angle is put into quantized, discrete bins, as depicted graphically in FIG. 3.

Another method of analysis is to compare the performance results of two or more antennas. For example, the Performa Pro™ antenna from RangeStar Wireless, Inc. can be compared to a typical monopole antenna. FIG. 7 is a polar plot of the total gain at theta =90 for the Performa Pro™ and the monopole. Although the Performa Pro™ (max =−1.1 dBi, mean =−4.3 dBi) has a lower peak gain than the monopole (max =−0.4 dBi, mean =−6.2 dBi), it exhibits a higher mean gain with shallower nulls. FIG. 8 is an example of data representing the fraction over a scan angle that the Performa Pro™ (designated "400301") and the monopole antenna will have a gain greater than a particular value, also known as "total gain" or "true gain".

It should be noted that computer simulation software is capable of simulating the conditions of an actual chamber test environment, and that such simulation software would then generate the data used to perform the probability calculations of the present invention. An example of such software is Ansoft HFSS7 3D EM™ simulation software.

It is also contemplated that the method of the present invention could be used to test antenna performance under actual usage conditions. In such a test environment, the test equipment of the present invention could be placed in a transmission tower, or placed freestanding external to the transmission tower but configured with the transmission tower, to measure antenna performance under actual usage conditions. A bare antenna or an antenna installed in a device would then be placed at varying angles of azimuth and elevation (e.g., nearby hills and valleys) to receive the signal from the transmission tower. Such a testing arrangement would be useful in pinpointing so-called "dead zones" within cell sites. Once such dead zones were identified, corrective measures could then be taken (e.g., additional transmission tower) within the cell site to maximize coverage and, hence, revenue.

Although the foregoing invention has been described in some detail by way of illustration and example for purposes of clarity of understanding, it will be obvious that certain changes and modifications may be practiced within the scope of the appended claims.

All publications, patents, and patent applications are herein incorporated by reference in their entirety to the same extent as if individual publication, patent, or patent application was specifically and individually indicated to be incorporated by reference in its entirety.

What is claimed is:

1. A method for determining the performance of an antenna, said method comprising:
    a) providing an excitation signal to the antenna;
    b) measuring the output signal voltage;
    c) adjusting the excitation signal frequency, the azimuth angle of position relative to the source of the excitation signal, and the angle of elevation relative to the source of the excitation signal, through a desired range of values;
    d) tabulating the antenna output signal values relative to the respective frequency, angle and elevation values;
    e) calculating the gain distribution function; and
    f) calculating the gain probability function.

2. A method for comparing the performance of two or more antennas, said method comprising:
    a) providing an excitation signal to each antenna;
    b) measuring the output signal voltage for each antenna;
    c) adjusting the excitation signal frequency, the azimuth angle of position relative to the source of the excitation signal, and the angle of elevation relative to the source of the excitation signal, through a desired range of values for each antenna;
    d) tabulating the antenna output signal values relative to the respective frequency, angle and elevation values for each antenna;
    e) calculating the gain distribution function for each antenna;
    f) calculating the gain probability function for each antenna; and
    g) comparing the performance results for each antenna.

3. A method for rating the performance of a wireless communication device which contains an antenna, said method comprising:
    a) providing an excitation signal to the antenna;
    b) measuring the output signal voltage;
    c) adjusting the excitation signal frequency, the azimuth angle of position relative to the source of the excitation signal, and the angle of elevation relative to the source of the excitation signal, through a desired range of values;
    d) tabulating the antenna output signal values relative to the respective frequency, angle and elevation values;
    e) calculating the gain distribution function; and
    f) calculating the gain probability function.

4. The method of claim 3, wherein said wireless communication device is selected from the group consisting of: cell phones, cordless phones, portable computers, personal data assistants and GPS-based location finding equipment.

5. A method of determining the performance of an antenna using computer simulation software, said method comprising:
    a) providing a simulated excitation signal to the antenna;
    b) measuring the simulated output signal voltage;
    c) adjusting the simulated excitation signal frequency, the simulated azimuth angle of position relative to the simulated source of the excitation signal, and the simulated angle of elevation relative to the simulated source of the excitation signal, through a desired range of values;
    d) tabulating the simulated antenna output signal values relative to the respective frequency, angle and elevation values;
    e) calculating the gain distribution function; and
    f) calculating the gain probability function.

6. A method for determining the performance of an antenna comprising:
    a) placing the antenna in a test environment;
    b) setting the azimuth range and elevation angle;
    c) providing an excitation signal;
    d) measuring the response in units of voltage out from the antenna;
    e) converting the measured voltage to power;
    f) calculating the gain distribution function;
    g) calculating the gain probability function;
    h) repeating steps b-g over a desired range of elevation angles, azimuth angles and frequency of excitation signal; and
    i) tabulating data of output signals, relative to azimuth, elevation and frequency.

7. The method of any of claims 1, 2, 3, 4, 5 or 6, wherein the performance is a measurement of the probability of a satisfactory link.

8. The method of claim 7, wherein the measurement of the probability of a satisfactory link is determined for different operation angles.

9. The method of claim 8, wherein the measurement of the probability of a satisfactory link is also determined for different environmental conditions.

10. A method for statistical characterization of the performance of an antenna, said method comprising:
    a) providing an excitation signal to the antenna;
    b) measuring the output signal voltage;
    c) adjusting the excitation signal frequency, the azimuth angle of position relative to the source of the excitation signal, and the angle of elevation relative to the source of the excitation signal, through a desired range of values;
    d) tabulating the antenna output signal values relative to the respective frequency, angle and elevation values;
    e) calculating the gain distribution function; and
    f) calculating the gain probability function.

11. A method for comparing the statistical characterization of the performance of two or more antennas, said method comprising:
    a) providing an excitation signal to each antenna;
    b) measuring the output signal voltage for each antenna;
    c) adjusting the excitation signal frequency, the azimuth angle of position relative to the source of the excitation signal, and the angle of elevation relative to the source of the excitation signal, through a desired range of values for each antenna;
    d) tabulating the antenna output signal values relative to the respective frequency, angle and elevation values for each antenna;
    e) calculating the gain distribution function for each antenna;
    f) calculating the gain probability function for each antenna; and
    g) comparing the statistical characterization of performance for each antenna.

12. A method for statistical characterization of the performance of a wireless communication device which contains an antenna, said method comprising:

a) providing an excitation signal to the antenna;

b) measuring the output signal voltage;

c) adjusting the excitation signal frequency, the azimuth angle of position relative to the source of the excitation signal, and the angle of elevation relative to the source of the excitation signal, through a desired range of values;

d) tabulating the antenna output signal values relative to the respective frequency, angle and elevation values;

e) calculating the gain distribution function; and f) calculating the gain probability function.

13. A method for statistical characterization of the performance of an antenna, said method comprising:

a) providing an excitation signal to the antenna;

b) measuring the output signal voltage;

c) adjusting the excitation signal frequency, the azimuth angle and the elevation angle of position relative to the transmitting device, through a desired range of values; and d) tabulating the transmitted signal values relative to the respective frequency, azimuth angle and elevation values.

14. A method for determining the performance of an antenna, said method comprising:

a) transmitting a signal from the antenna;

b) receiving the signal with test equipment;

c) adjusting the transmitted signal frequency, the azimuth angle and the elevation angle of position relative to the receiving device, through a desired range of values;

d) tabulating the received signal values relative to the respective frequency, azimuth angle and elevation values;

e) calculating the gain distribution function; and f) calculating the gain probability function.

15. The method of claim 14, wherein the performance includes a measurement of power level used to complete a satisfactory link at a specific confidence level, relative to the frequency, azimuth angle and elevation values.

16. The method of claim 14, wherein the performance includes a measurement of radiation absorbed by the antenna user, or a phantom head, relative to the frequency, azimuth angle and elevation values.

17. The method of claim 14, wherein the data collection steps a) to c) are performed using computer simulation software rather than by actual test measurements.

18. A method for statistical characterization of the performance of an antenna, said method comprising:

a) transmitting a signal from the antenna;

b) receiving the signal with test equipment;

c) adjusting the transmitted signal frequency, the azimuth angle and the elevation angle of position relative to the receiving device, through a desired range of values;

d) tabulating the received signal values relative to the respective frequency, azimuth angle and elevation values;

e) calculating the gain distribution function; and f) calculating the gain probability function.

19. A method for statistical characterization of the performance of an antenna, said method comprising:

a) transmitting a signal from the antenna;

b) receiving the signal with test equipment;

c) adjusting the transmitted signal frequency, the azimuth angle and the elevation angle of position relative to the receiving device, through a desired range of values;

d) tabulating the received signal values relative to the respective frequency, azimuth angle and elevation values.

* * * * *